United States Patent [19]

Baccini

[11] Patent Number: 5,449,409
[45] Date of Patent: Sep. 12, 1995

[54] DEVICE TO PROCESS GREEN-TAPE TYPE CIRCUITS

[76] Inventor: Gisulfo Baccini, Mignagola di Carbonera, Italy

[21] Appl. No.: 944,269

[22] Filed: Sep. 14, 1992

[30] Foreign Application Priority Data

Sep. 30, 1991 [IT]  Italy .................................. 91A000157
Sep. 30, 1991 [IT]  Italy .................................. 91A000158

[51] Int. Cl.⁶ ..................... B05C 11/00; B05C 13/00; B65G 47/00
[52] U.S. Cl. ..................................... 118/668; 118/500; 118/712; 101/35; 198/345.1; 198/346.2; 198/418; 198/456
[58] Field of Search ............... 101/35, DIG. 30; 118/500, 676; 198/343.2, 345.1, 346.2, 348, 362, 431, 432, 433, 456, 346.1, 346.2

[56] References Cited

U.S. PATENT DOCUMENTS

| | | | |
|---|---|---|---|
| 3,580,377 | 5/1971 | Kiehl ................... | 198/464.1 |
| 3,889,797 | 6/1975 | Naito et al. ............. | 198/346.1 |
| 4,039,070 | 8/1977 | Harrison ................ | 198/370 |
| 4,068,994 | 1/1978 | Cadwallader et al. . | |
| 4,185,814 | 1/1980 | Buchmann et al. ...... | 271/108 |
| 4,362,486 | 12/1982 | Davis et al. .......... | 271/108 X |
| 4,515,264 | 5/1985 | Sticht ................. | 198/345.3 X |
| 4,525,597 | 6/1985 | Abe ................... | 437/218 X |
| 4,591,044 | 5/1986 | Ogami et al. . | |
| 4,698,192 | 10/1987 | Kuze et al. ........... | 264/60 X |
| 4,828,304 | 5/1989 | No et al. ............. | 294/64.1 X |
| 4,981,074 | 1/1991 | Machita et al. . | |

FOREIGN PATENT DOCUMENTS

| | | |
|---|---|---|
| 63-312035 | 12/1988 | Japan . |
| 1128802 | 5/1989 | Japan . |
| 2245332 | 10/1990 | Japan . |
| 1557707 | 12/1979 | United Kingdom . |

OTHER PUBLICATIONS

European Search Report.

*Primary Examiner*—David A. Simmons
*Assistant Examiner*—M. Curtis Mayes
*Attorney, Agent, or Firm*—Nixon & Vanderhye

[57] ABSTRACT

Device to process green-tape type circuits, in which a green-tape foil (12) of alumina in the raw state or of another like or analogous material (green-tape foil) acts as a support for circuits (solar cells, etc.) and contains holes for electrical connection of circuits borne on other green-tape foils positioned above or below, the green-tape foil (12) undergoing a printing operation to fill the electrical connection holes and a possible operation of printing an electrical circuit, these printing operations being performed by associating the green-tape foil (12) with a band of paper or with a mesh or another analogous material (26) positioned between the green-tape foil (12) and a supporting base (29) for the printing, the device comprising in cooperation:

a step-by-step conveyor (60) with a shaft (53) able to move step-by-step and stationary lateral surfaces (13) together with rigid supports (20), the step-by-step conveyor (60) comprising at least one loading station (16) and one discharge station (19);

a transfer conveyor (58) substantially parallel to the step-by-step conveyor (60);

a spongy platform (40) able to move step-by-step on the transfer conveyor (58) between the loading station (16) and the discharge station (19), the spongy platform (40) comprising an upper surface (29) to support the green-tape foil (12), a position identification station (17) and a printing station (18) being included between the loading station (16) and discharge station (19), these stations being single stations or being associated with each other in a number of two or more.

5 Claims, 7 Drawing Sheets

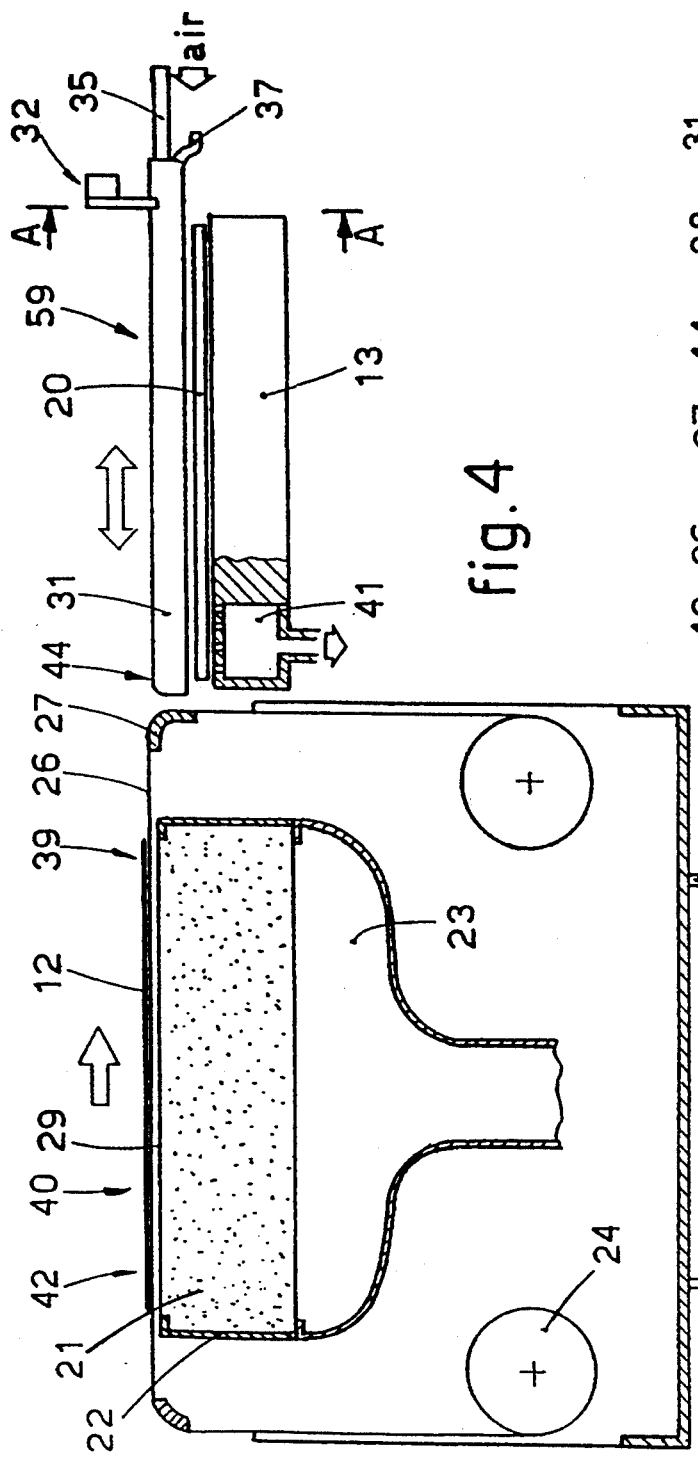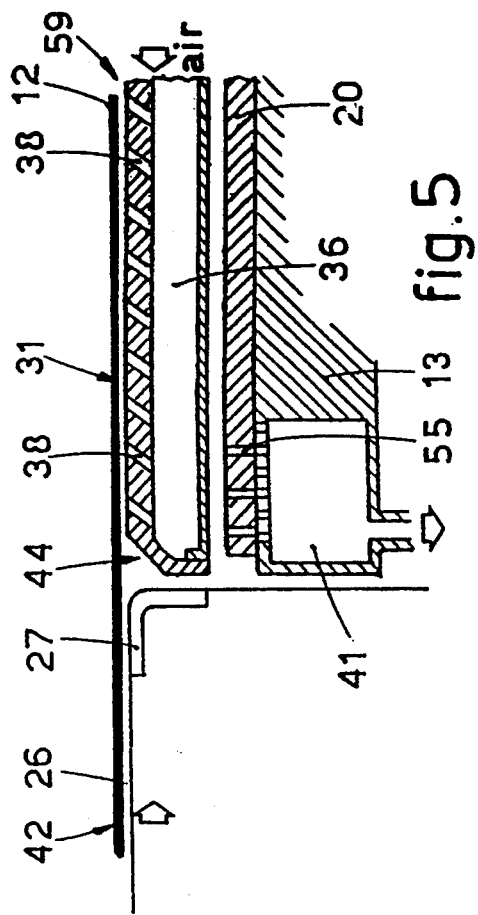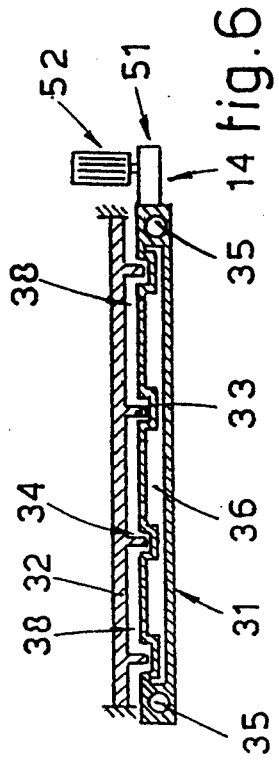

DEVICE TO PROCESS GREEN-TAPE TYPE CIRCUITS

BACKGROUND OF THE INVENTION

1. Field of the Invention

This invention concerns a device to process hybrid circuits according to the so-called green-tape technology, as set forth in the main claim.

2. Discussion of Prior Art

To be more exact, the device makes possible the operations of conveying, printing and filling of connecting holes (screen process printing) and discharge of the foils in the so-called green-tape technology.

The device according to the invention can also be employed to carry out operations for the processing of solar cells, printed circuits and anything else which can be used with the same system.

Hybrid circuits in the so-called green-tape technology consist of very thin foils of alumina in the raw state or of another like or analogous material, which have a circuit printed on one or both of their two faces.

The green-tape foils are superimposed on each other in numbers amounting even to some tens and are compressed to achieve reciprocal bonding so as to produce a multi-layer product of a slender thickness.

The various components of the circuit comprised in the individual foils are possibly set in communication with each other through suitable holes made in the foils and filled with a conductive material.

The green-tape foils of the technology of the state of the art are conveyed on belts, for instance, of paper to the various processes so as to prevent, during filling of the connecting holes with a conductive material, that conductive material being split on and/or adhering to the support.

Thereafter the green-tape foils are dried, assembled in a pre-set number and compressed to produce a multi-layer electrical circuit.

These engagement, positioning and insertion operations are done by hand and entail long times and high costs as well as a great number of rejects owing to the lack of accuracy in the filling and printing operations (screen process printing) and to the damage caused by manual handling.

SUMMARY OF THE INVENTION

The present applicant have designed, tested and obtained this invention so as to be able to obtain an automatic or semi-automatic working cycle and to achieve further advantages.

This invention is set forth and characterized in the main claim, while the dependent claims describe variants of the idea of the embodiment.

Suitable rigid supports stacked in a suitable container and bearing green-tape foils are taken from that container one by one and are positioned in a continuous sequence on a conveyor able to move step by step.

The green-tape foils have standard dimensions, are placed on their specific rigid supports and contain connecting holes and other possible holes and/or marks, reference holes or marks, for instance.

The rigid supports contain holes to identify the presence of the green-tape foil and also a plurality of small holes arranged on part of their surface. These small holes have the task of retaining the green-tape foil on the rigid support when a negative pressure is created below the rigid support, or else of lifting the green-tape foil from the rigid support when air under pressure is created below the rigid support.

The rigid supports are thus retained on the step-by-step conveyor by negative pressure, and in the station for engagement of the green-tape foil suitable jets of air cooperate with the small holes in the rigid support so as to keep the green-tape foils raised and to assist their engagement and removal.

The green-tape foil is taken from the rigid support and positioned on a flat plate having a spongy supporting body, hereinafter called "spongy platform".

A sheet of transpirable material, which is advantageously paper of the type used for cigarettes, is placed between the spongy platform and the green-tape foil.

The sheet of transpirable material supported on the spongy platform is able to bear the green-tape foil during the printing and screen process printing steps.

The green-tape foil is handled by suitable engagement and positioning means, which consist advantageously of movable arms that support suction means terminally.

The device according to the invention is equipped with conveyor means which can convey the spongy platform bearing the green-tape foil to successive stations along the processing line.

In these successive stations are performed respectively the operations of engaging the green-tape foil and placing it on the spongy platform, identifying the exact position of the green-tape foil, filling the connecting holes in the green-tape foil with a conductive material and/or printing the circuit.

The device according to the invention comprises a discharge station in which the printed green-tape foil is re-positioned on the rigid support and is sent to the successive processes.

The device of this invention enables the green-tape foil to be handled semi-automatically or automatically without using machine operators but very accurately in very short cycle times and with an excellent finished result.

According to the invention the sheet of transpirable paper is provided to assist the operations of removing and aspirating the green-tape foil and also to prevent the conductive material dirtying the spongy platform and the circuit.

The spongy platform is borne on a container, within which a negative pressure of a desired value is created so as to keep the green-tape foil and the transpirable sheet always adhering closely to the upper surface of the spongy platform. That upper surface is smooth and flat and is conformed in such a way that it does not create even the smallest misalignments of the green-tape foil placed thereupon.

According to the invention the sheet of transpirable material placed between the upper surface of the spongy platform and the green-tape foil is replaced automatically whenever the green-tape foil is changed.

As we said above, the transpirable material consists, for instance of paper used for cigarettes or another analogous material, or may consist of a mesh with very thin weft elements (a mesh for screen process printing, for instance).

The spongy platform assembly according to this invention includes winding/unwinding rollers which enable the transpirable material to run in the form of a band.

The winding/unwinding rollers are capable of an intermittent motion, which is actuated at the moment of removal of the screen-printed foil for the required period of time, thus enabling the transpirable material to be moved forwards by a required value so as to replace the transpirable material for the next green-tape foil.

The band of transpirable material hinders the passage of the substances such as the paste of conductive material used to fill the connecting holes in the green-tape foil.

In this way, during the filling of the holes in the green-tape foil with the screen process printing the conductive filling material is prevented from reaching the porous, spongy platform and obstructing the holes therein and damaging the platform.

In the meantime the band of transpirable material does not hinder the passage of the air due to the negative pressure in the container, so that the work of filling the connecting holes in the green-tape foil is assisted.

During the operation of discharging the green-tape foil from the spongy platform onto the rigid support the band of transpirable material is caused to advance, thus taking with it the green-tape foil and discharging the finished piece of green-tape foil.

By using a direction-switching edge of the container and/or the spongy platform it is possible to detach the green-tape foil from the transpirable band while the green-tape foil continues advancing in a substantially straight direction.

Thus the next green-tape foil placed on the spongy platform comes into contact with a clean segment of the band of transpirable material without any residues of the conductive material.

BRIEF DESCRIPTION OF THE FIGURES

The attached figures are given as a non-restrictive example and show a preferred lay-out of the invention as follows:

FIG. 4 shows a diagrammatic cross-section of the means which transfers the green-tape foil from the spongy platform of FIG. 3 to a rigid support;

FIG. 5 shows a partial section of the spongy platform and rigid support;

FIG. 6 shows a section along the line A—A of FIG. 4;

DETAILED DESCRIPTION OF PREFERRED EMBODIMENT

The number 10 in the figures indicates a device to process hybrid circuits of the green-tape type according to the invention.

The device 10 is connected to an automatic line 46 feeding rigid supports 20 that bear green-tape foils 12 to be printed and also an automatic line 47 that removes printed green-tape foils 12.

Figure 2:
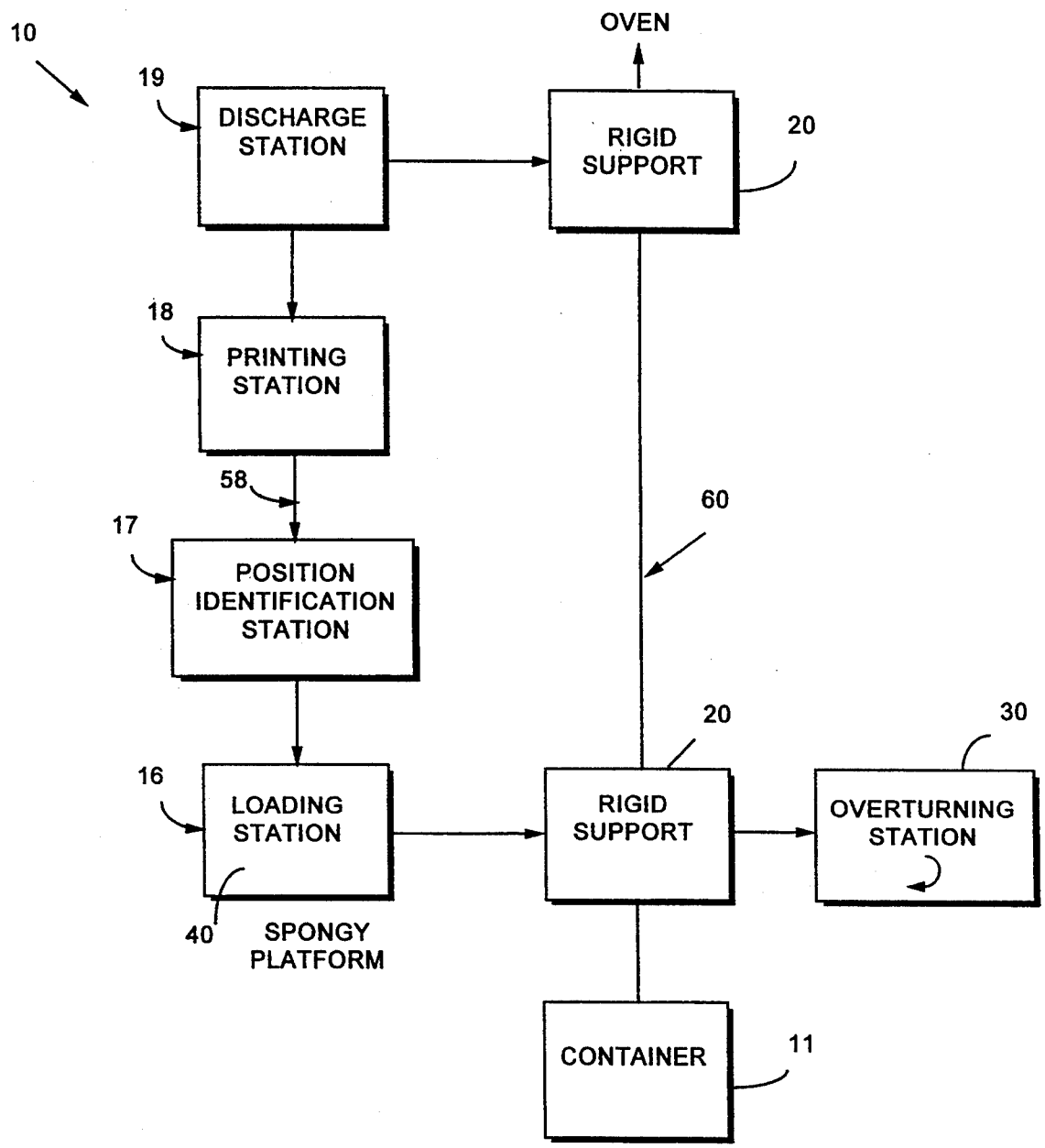
FIG. 2 shows a partial block diagram of the device of FIG. 1.

FIG. 2 shows in a block diagram the main processing steps which are accomplished by the device 10 of this invention.

Specific rigid supports 20, each of which bears its own green-tape foil 12 and is placed on a step-by-step conveyor 60, are taken one by one from a suitable container 11 which runs along the feeder line 46.

The rigid supports 20 are held and stacked in appropriate grooves within the container 11; the grooves are spaced apart enough to enable a rigid support 20 to be taken automatically without coming into contact with the neighbouring rigid support 20.

In this case the step-by-step conveyor 60 consists of two stationary lateral surfaces 13 and a movable shaft 53 capable of an intermittent movement in steps.

The withdrawal of the rigid supports 20 from the container 11 is carried out in this case by the movable shaft 53, which is positioned between the two stationary lateral surfaces 13.

The movable shaft 53 protrudes lengthwise beyond the stationary lateral surfaces 13 and passes beneath the lowest rigid support 20 held in the container 11.

Then the movable shaft 53 with an ascending, retreating and then descending movement takes the rigid support 20 and deposits it on the stationary lateral surfaces 13.

During this movement the container 11 descends by one step orthogonally to the feeder line 46, thus making available for removal the next higher rigid support 20.

The step-by-step movable shaft 53 is then again caused to protrude and is brought into cooperation with the next rigid support 20 positioned in the container 11.

The removal operation is performed in such a way that the movable shaft 53, by one single movement, takes the second rigid support 20 from the container 11 and at the same time causes the first rigid support 20 already taken to advance by one step on the stationary surfaces 13.

The removal cycle is repeated until the container 11 has been emptied, and the empty container 11 is then removed along the feeder line 46.

Figure 1:
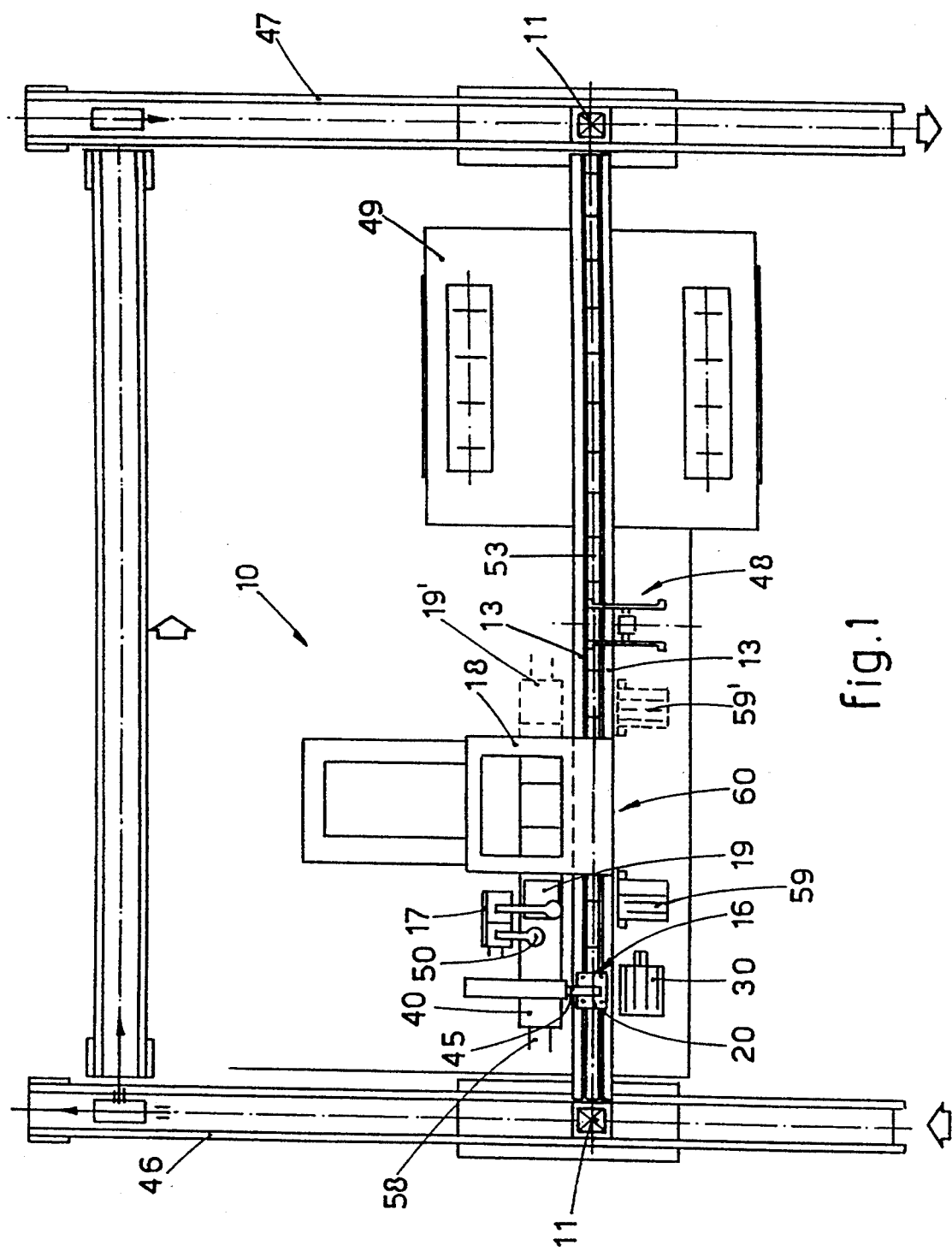
FIG. 1 is a plan view of a device to produce hybrid circuits of the green-tape type according to the invention.

According to an advantageous form of the invention the empty container 11 is brought automatically to the removal line 47 to receive rigid supports 20 together with printed green-tape foils 12 leaving a drying oven 49 (FIG. 1).

Figure 8:
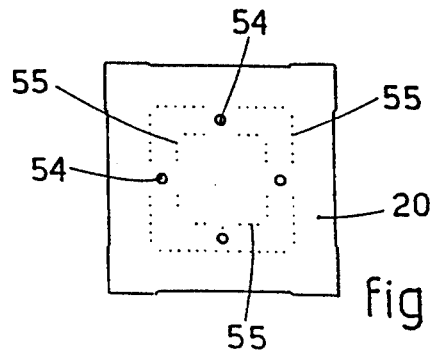
FIG. 8 shows a possible form of embodiment of the rigid support.

The rigid supports 20 (FIG. 8) contain holes 54 for identification of the presence of the green-tape foils 12 and contain also a plurality of small holes 55 arranged on a part of their surface.

These small holes 55 assist separation of the green-tape foil 12 from the rigid support 20 when air under pressure is blown from below the support 20 and, passing through the small holes 55 in the support 20, lifts and distances the green-tape foil 12 from the rigid support 20.

The green-tape foil 12 is sent to a removal station and is taken from its respective rigid support 20. In this removal station each single rigid support 20 is held on the stationary surfaces 13, for instance by suction means applying negative pressure, while suitable jets of air passing through the small holes 55 appropriately contained in the rigid support 20 lift the green-tape foil 12 and keep it lifted.

In the removal station the green-tape foil 12 is taken from the rigid support 20, is possibly overturned in an overturning station 30 and is then transferred and positioned on a spongy platform 40 lying in a loading station 16.

Figure 10:
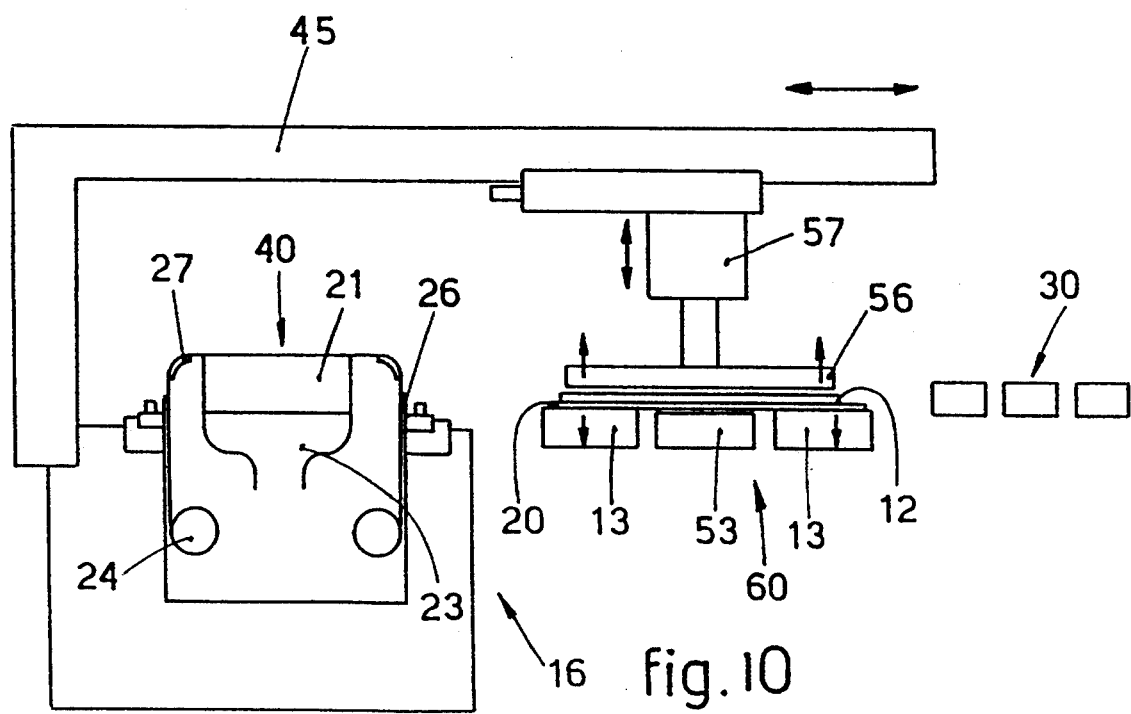
FIG. 10 is a diagram of a working step of the device according to the invention.

In this example the green-tape foil 12 is taken from the rigid support 20 by a movable arm 45, which supports suction means 56 (FIG. 10) at its end.

The movable arm 45 can move perpendicularly to the direction of forward movement of the movable shaft 53 so as to bring the suction means 56 above the rigid supports 20 passing by on the shaft 53 able to move step-by-step.

Thereafter the suction means 56 are lowered onto the rigid support 20.

During this step two effects of negative pressure are created, of which the first is a greater intensity and is applied from below the rigid support 20 to keep the supports 20 on the stationary surfaces 13, whereas the second is of less intensity and is applied by an aspiration chamber 57 below the movable arm 45 so as to remove the green-tape foil 12 from the rigid support 20; this removal is assisted by air blown through the small holes 55.

The green-tape foil 12 is then released by the suction means 56 onto the spongy platform 40 after withdrawal of the movable arm 45 or is brought into cooperation with the overturning station 30 by a further forward movement of the movable arm 45 if the green-tape foil 12 has to be printed on its reverse face.

The green-tape foil 12, after being overturned, is reengaged by the suction means 56 and placed on the spongy platform 40.

Figure 11:
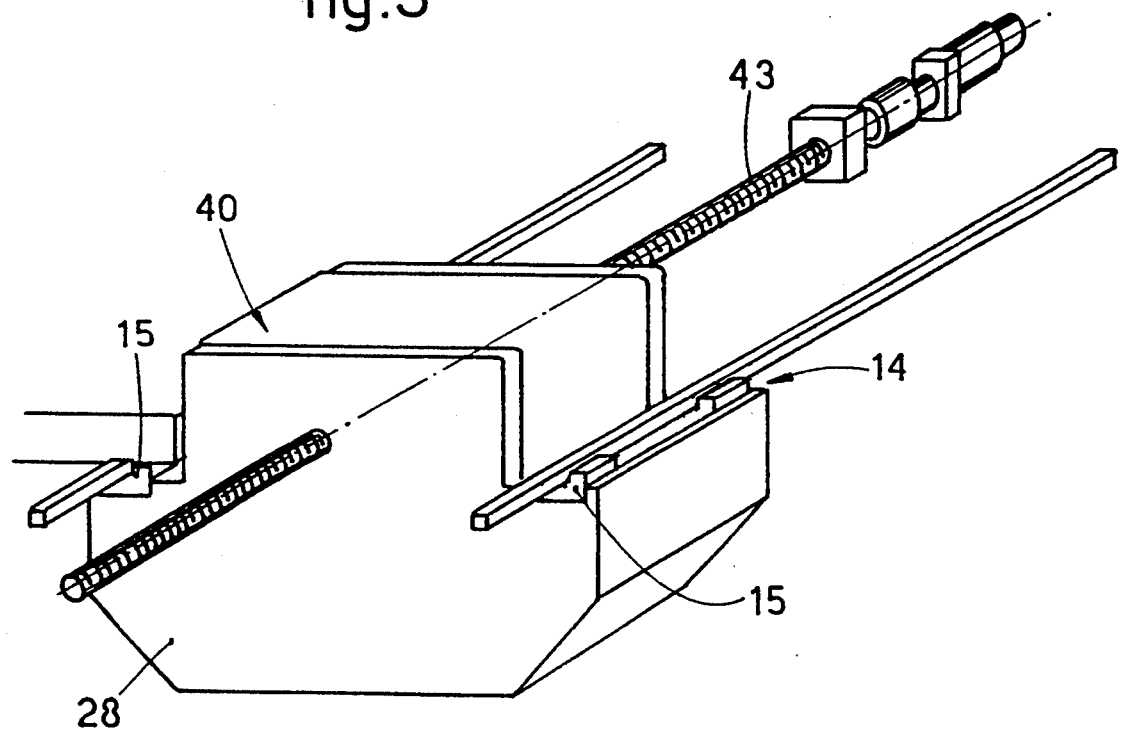
FIG. 11 is a diagram of a possible means to move the spongy platform.

The spongy platform 40 is equipped with linear displacement means 14 (FIG. 11), which in this nonrestrictive example consist of linear guides 15 cooperating with a suitable drive means, which is not shown here.

In this case the drive means consists of a D.C. motor with a ball-bearing screw 43, the motor being controlled electronically.

The displacement means 14 enable the spongy platform 40 to be moved to various processing stations with the greatest possible accuracy in view of the necessity to ensure correct positioning of the green-tape foil 12 during the printing step.

In this example the processing stations are positioned on a transfer conveyor 58 parallel to the stations of the step-by-step conveyor 60.

The spongy platform 40 is moved from loading station 16 to a position identification station 17, in which the exact position of the green-tape foil 12 and therefore of the micro-holes or reference marks contained on the green-tape foil 12 is detected, by telecameras 50 for instance.

This identification, which can be performed by one or more telecameras 50, detects accurately the position of two or more reference marks or holes on the green-tape foil 12. The identification determines on a horizontal plane the exact position of the green-tape foil 12 on the spongy platform 40; this position is detected according to an axis lengthwise to the path of the foil 12, according to an axis crosswise to the path of the foil 12 and according to the orientation of the foil 12 on its plane.

Thereafter the spongy platform 40 reaches a printing station 18 in which are carried out the operations of printing a circuit and/or filling the connecting holes in the green-tape foil 12 with conductive material by means of a screen process printing system.

The spongy platform 40 and the printing means in the printing station 18 are correctly positioned reciprocally by traversing and rotation movements on a plane parallel to the plane of the green-tape foil 12 being processed; these movements may affect the spongy platform 40 or the printing means or both of them.

After the printing operation the spongy platform 40 is transferred to a discharge station 19, in which the finished green-tape foil 12 is re-positioned on its relative rigid support 20, which has arrived at the discharge station 19 in the meantime and is firmly secured to its element on the movable shaft 53.

In the discharge station 19 the spongy platform 40 cooperates with an engagement and delivery assembly 59 in the re-positioning of the rigid support 20 on the movable shaft 53 and stationary lateral surfaces 13.

In this example the discharge station 19 is positioned upstream of the printing station 18.

According to a variant the discharge station 19' and the relative engagement and delivery assembly 59' are positioned downstream of the printing station 18.

Next, the green-tape foil 12 together with the rigid support 20 on which it is positioned is sent to a visual checking station 49 and thence to an oven 49 for a drying step.

Upon leaving the drying step the rigid supports 20 bearing the finished green-tape foils 12 are stacked in a container 11 positioned on the removal line 47 by means of a process which is the reverse of the process of removal from the container 11.

The spongy platform 40 comprises a transpirable cushion 21 of a spongy material, such as sintered bronze for instance or another material able to retain a perfectly flat upper surface 29 while allowing an aspiration action to pass through.

A sheet of transpirable material 26, on which is positioned the green-tape foil 12 to be processed (FIG. 3), is moved on the upper surface 29.

The transpirable cushion 21 is upheld on a container 22, which forms therewith an inner chamber 23 (FIG. 4).

A negative pressure of a desired value is created within the inner chamber 23 by aspiration means of a known type, which are not shown here and are unimportant for the purposes of the invention. This negative pressure enables the green-tape foil 12 to stay always immovable in the exact position where it has been placed.

A sheet 26 in the form of a band is located between the green-tape foil 12 and the upper surface 29 of the spongy platform 40.

Figure 3:
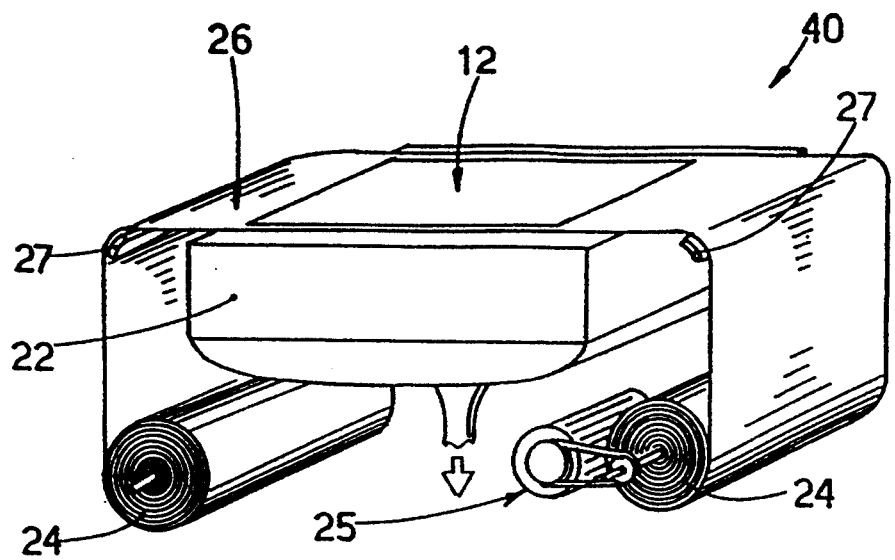
FIG. 3 is a three-dimensional view of a spongy platform for processing green-tape type circuits according to the invention.

The spongy platform 40 according to the invention cooperates with winding/unwinding rollers 24 driven by a suitable known motor 25, which is unimportant for the purposes of the invention (FIG. 3).

The winding/unwinding rollers 24 make possible the intermittent movement of the band 26 of transpirable material by a desired length, the band 26 consisting advantageously of transpirable paper or steel mesh with very thin weft elements or another material suitable for the purpose.

The length of this movement is equal to the segment of material required to have a new clean segment of band 26 under the next green-tape foil 12.

The band 26 cooperates with lateral guides 27 which divert its path. These lateral guides 27 are intended to detach the green-tape foil 12 from the band 26 when the green-tape foil 12, having undergone the printing action, is transferred onto its rigid support 20 in the discharge station 19.

During this step the rigid support 20 cooperates with an engagement and delivery assembly 59, which in this case consists of a movable plate 31 that cooperates with the band 26 in the discharge of the green-tape foil 12 from the spongy platform 40.

The movable plate 31 cooperates also with a stationary abutment 32, which comprises abutment ribs 33 that mesh with lengthwise grooves 34 made in the movable plate 31 and oriented in the direction of movement of the plate 31.

The movable plate 31 comprises horizontal guides 35 and is moved lengthwise by suitable motor means 52 including for instance, a gearwheel with a rack 51 (FIG. 6) or another analogous system.

The movable plate 31 contains a manifold 36, which is fed with compressed air through a duct 37 and feeds inclined holes 38.

The inclined holes 38 (FIG. 5) are tilted in the same direction as the direction of movement of the green-tape foil 12 from the band 26 and have the purpose of creating a fluid bed to support and convey the green-tape foil 12.

The stationary abutment 32 is positioned vertically in the vicinity of the position which the front edge 39 of the green-tape foil 12 has to take up on the rigid support 20.

The movable plate 31 can be moved (FIG. 7a) from a position very near an inversion edge 27 of the band 26 to a fully retracted position (FIG. 7d) cooperating with the stationary abutment 32.

The band 26 delivers the green-tape foil 12 to the plate 31 either as soon as the foil 12 has been printed or after the foil 12 has been dried.

The band 26 includes the inversion edge 27, which diverts the path of the band 26 quickly and sharply.

Figure 7A:
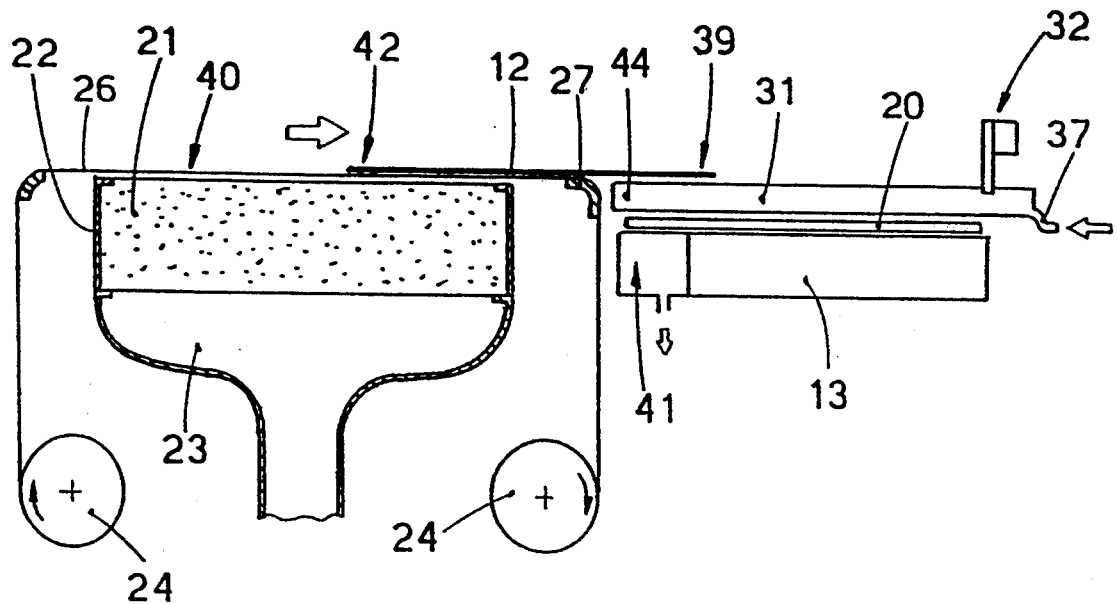
FIGS. 7a–7d show a cycle of the discharge and delivery of a green-tape foil.

The inversion edge 27 cooperates with an upstream edge 44 of the movable plate 31 in the delivery and detaching of the green-tape foil 12 (FIG. 7a).

Figure 7B:
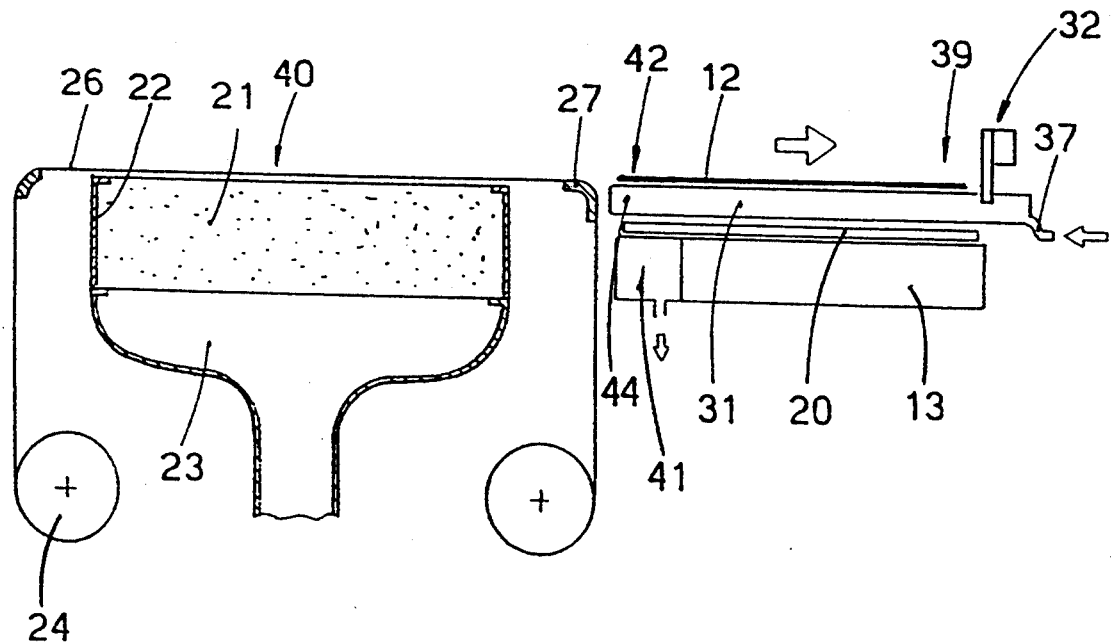

When the green-tape foil 12 has been detached from the band 26, to which it may have adhered owing to the printing paste, and when a great part of the foil 12 is on the movable plate 31, the jets of air or fluid under pressure coming from the inclined holes 38 carry the foil 12 forwards on the movable fluid bed until the front edge 39 of the green-tape foil 12 abuts against the stationary abutment 32 (FIG. 7b).

Figure 7C:
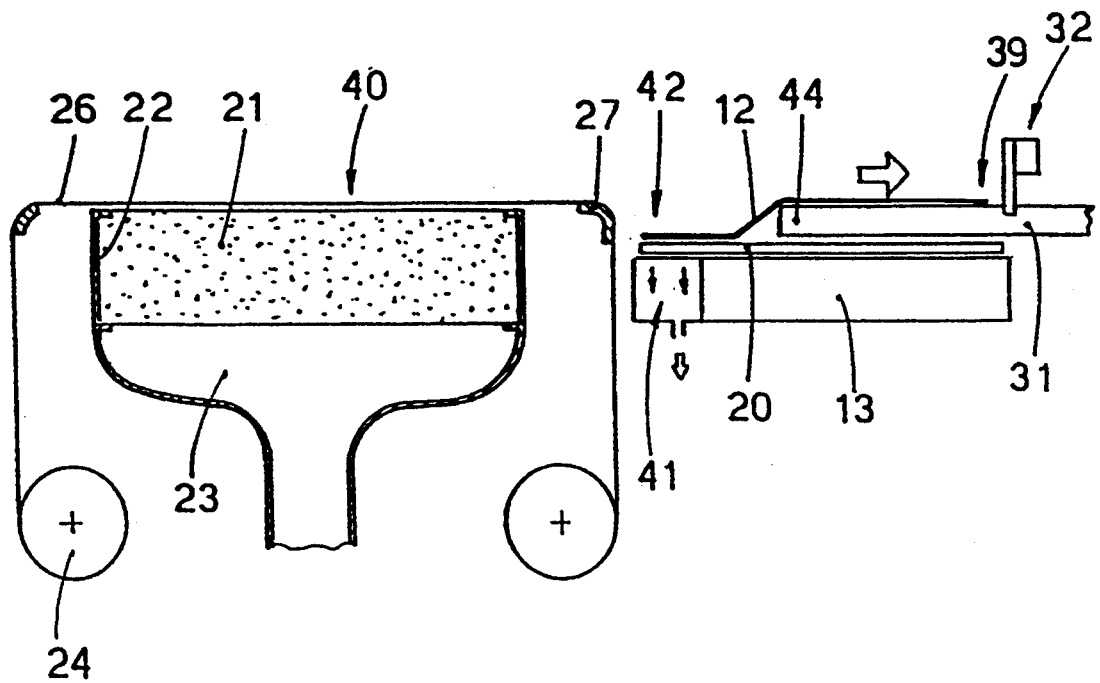
Figure 7D:
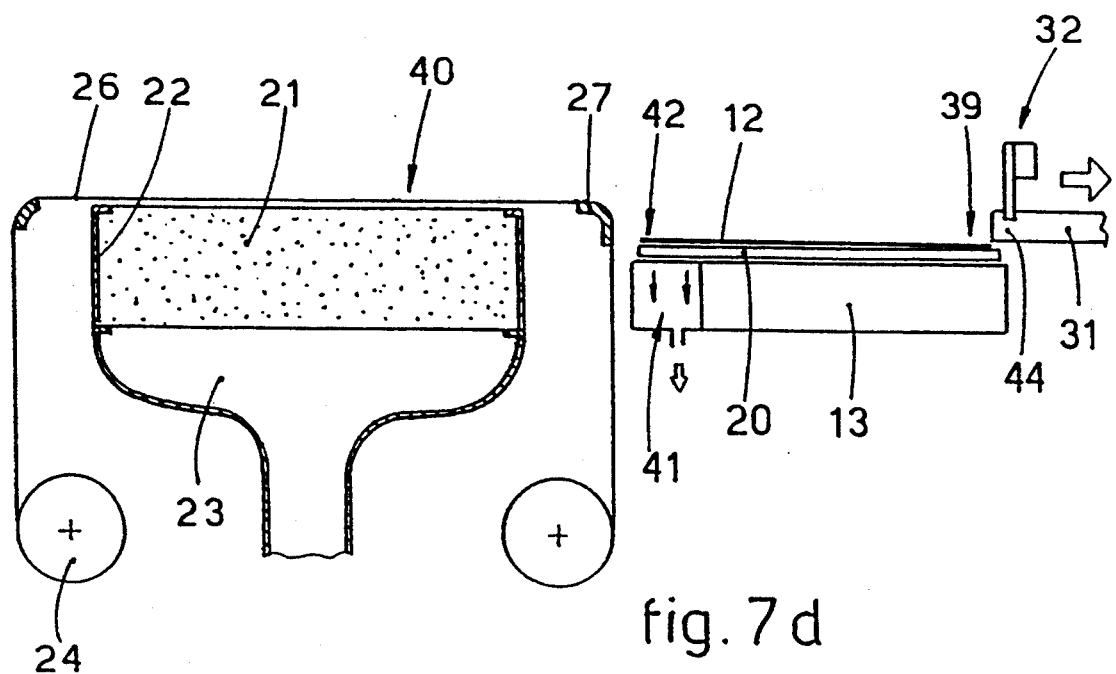
Figure 9:
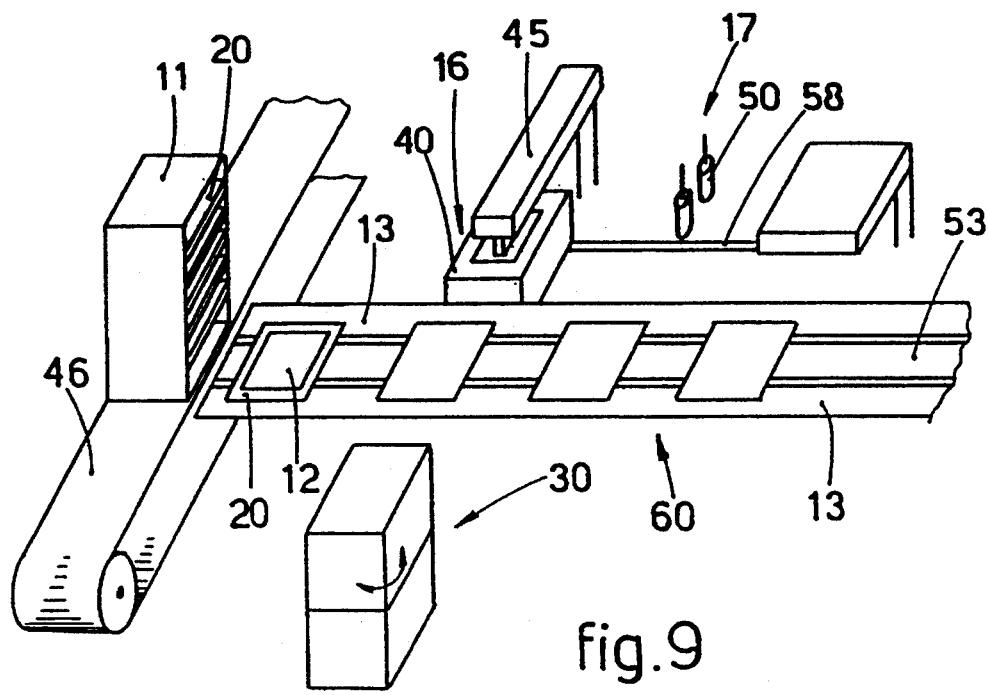
FIG. 9 is a three-dimensional view of a part of a device according to the invention.

When the green-tape foil 12 abuts against the stationary abutment 32, the movable plate 31 starts its retraction movement (FIG. 7c) and the rear edge 42 of the green-tape foil 12 slides onto the rigid conveying support 20.

This rear edge 42 cooperates with micro-holes 55 (FIG. 5) contained in that zone of the rigid support 20; these microholes 55 are kept under negative pressure by the action exerted in this example by a negative pressure chamber 41 cooperating with the stationary surfaces 13.

This action of negative pressure applied through the micro-holes 55 retains the rear edge 42 of the green-tape foil 12, while the movable plate 31 moves away (FIG. 7d) and leaves the green-tape foil 12 positioned flat on the rigid support 20 without mechanical damage and without any risk of the spreading of any conductive material which may still be wet.

It should be noted that the delivery motion of the movable plate 31 can be perpendicular to the direction of receipt of the green-tape foil 12. In this case it may be necessary to include an auxiliary stationary abutment 32 and auxiliary inclined holes 38.

The band 26 of transpirable material allows the air to pass through but obstructs the passage of substances such as the conductive material used to fill the holes in the green-tape foil 12. In this way that conductive material cannot reach or soil the transpirable cushion 21.

The spongy platform 40 according to the invention, when it has transferred the green-tape foil 12 to the rigid support 20, re-positions itself in the loading station 16 to process another green-tape foil 12.

The discharge station 19 may also coincide with one of the other processing stations, and the position identification station 17 too may coincide with any one of the other stations or be a station by itself.

I claim:

1. Device for processing green-tape foil circuits, in which a green-tape foil (12) is a support for electrical circuits and contains holes for electrical connection of other circuits on other adjacent green-tape foils, the device comprising:

a step-by-step conveyor (60), including a plurality of rigid supports (20), for moving step-by-step a plurality of green-tape foils, each located on one of said rigid supports, along a processing line to a loading station (16) and from a discharge station (19);

a transfer conveyor (58) located substantially parallel to the step-by-step conveyor (60) and accurately moveable between said loading station (16) and said discharge station (19);

a spongy platform (40) accurately moveable step-by-step on the transfer conveyor (58) between said loading station (16) and said discharge station (19), the spongy platform (40) including an upper surface (29) for supporting said green-tape foil (12);

at least one loading station (16) for removing green-tape foils (12) from said rigid support of said step-by-step conveyor and placing said green-tape foils (12) on said spongy platform (40);

at least one discharge station (19) for removing said green-tape foils (12) from said spongy platform (40) and for replacing said green-tape foils (12) on respective ones of said rigid supports (20) of said step-by-step conveyor (60);

a position identification station (17), located along said transfer conveyor (58) between the loading station (16) and discharge station (19), for determining and adjusting the relative position in two axes of one of said green-tape foils and a printing station; and a printing station (18), also located along said transfer conveyor between the loading station (16) and discharge station (19), and, responsive to said position identification station, for at least one of filling at least one of the electrical connection holes and printing at least one electrical circuit on said one of said green-tape foils (12) wherein the spongy platform (40) includes a band (26) of transpirable material for supporting a foil, said band carried by winding/unwinding rollers (24) and a motor (25) for driving said rollers for intermittent movement of the band (26), the band moving in a direction perpendicular to the direction of movement of the transfer conveyor.

2. Device as in claim 1, wherein the spongy platform (40) includes lateral guides (27) around which said band passes for detaching the green-tape foil (12), the guides (27 being substantially parallel to the step-by-step conveyor (60).

3. Device as in claim 2, wherein said at least one discharge station includes a plate (31) positioned above said rigid support (20) and movable from a green-tape foil engagement position near said band to a position of full delivery away from said band.

4. Device as in claim 3, wherein said plate (31) cooperates with a stationary abutment (32) to position a leading end (39) of the green-tape foil (12) on said rigid support when said foil is transferred from said band to said plate.

5. Device as in claim 4, wherein said plate (31) contains inclined holes (38) on a surface that positions the green-tape foil (12), said holes (38) being inclined in the direction of forward movement of the green-tape foil (12) during the transfer of the green-tape foil (12) to the plate (31) and being fed with a fluid under pressure.

* * * * *